United States Patent
Danovitch et al.

(10) Patent No.: US 7,786,588 B2
(45) Date of Patent: Aug. 31, 2010

(54) COMPOSITE INTERCONNECT STRUCTURE USING INJECTION MOLDED SOLDER TECHNIQUE

(75) Inventors: David D. Danovitch, Quebec (CA); Mukta G. Farooq, Hopewell Junction, NY (US); Michael A. Gaynes, Vestal, NY (US)

(73) Assignee: International Business Machines Corporation, Armonk, NY (US)

(*) Notice: Subject to any disclaimer, the term of this patent is extended or adjusted under 35 U.S.C. 154(b) by 58 days.

(21) Appl. No.: 11/307,291

(22) Filed: Jan. 31, 2006

(65) Prior Publication Data

US 2007/0178625 A1 Aug. 2, 2007

(51) Int. Cl.
*H01L 23/52* (2006.01)
*H01L 23/48* (2006.01)
*H01L 29/40* (2006.01)

(52) U.S. Cl. .............. 257/772; 257/E21.511; 257/669; 257/737; 252/513

(58) Field of Classification Search .......... 257/E21.511, 257/E23.021, 772, 737, 669, 734, E31.127; 252/513, 514; 228/106, 123.1, 180.22; 174/257; 438/27, 65
See application file for complete search history.

(56) References Cited

U.S. PATENT DOCUMENTS

| | | | |
|---|---|---|---|
| 4,642,889 A | 2/1987 | Grabbe | |
| 4,664,309 A | 5/1987 | Allen et al. | |
| 4,705,205 A | 11/1987 | Allen et al. | |
| 5,244,143 A | 9/1993 | Ference et al. | |
| 5,393,371 A | 2/1995 | Chang et al. | |
| 5,431,328 A * | 7/1995 | Chang et al. | 228/180.22 |
| 5,477,087 A * | 12/1995 | Kawakita et al. | 257/737 |
| 5,775,569 A | 7/1998 | Berger et al. | |
| 5,994,781 A * | 11/1999 | Smith | 257/773 |
| 6,105,852 A | 8/2000 | Cordes et al. | |
| 6,127,735 A | 10/2000 | Berger et al. | |
| 6,133,633 A | 10/2000 | Berger et al. | |
| 6,149,122 A | 11/2000 | Berger et al. | |
| 6,231,333 B1 | 5/2001 | Gruber et al. | |
| 6,286,226 B1 * | 9/2001 | Jin | 33/706 |
| 6,332,569 B1 | 12/2001 | Cordes et al. | |
| 6,337,445 B1 * | 1/2002 | Abbott et al. | 174/260 |
| 6,340,630 B1 | 1/2002 | Berger et al. | |

(Continued)

FOREIGN PATENT DOCUMENTS

JP 7-66209 3/1995

*Primary Examiner*—Chris C Chu
(74) *Attorney, Agent, or Firm*—Joseph Petrokaitis; Hoffman Warnick LLC

(57) ABSTRACT

Composite interconnect structure forming methods using injection molded solder are disclosed. The methods provide a mold having at least one opening formed therein with each opening including a member of a material dissimilar to a solder to be used to fill the opening, and then fill the remainder of each opening with solder to form the composite interconnect structure. The resulting composite interconnect structure can be leveraged to achieve a much larger variety of composite structures than exhibited by the prior art. For example, the material may be chosen to be more electrically conductive than the solder portion, more electromigration-resistant than the solder portion and/or more fatigue-resistant than the solder portion. In one embodiment, the composite interconnect structure can include an optical structure, or plastic or ceramic material. The optical structure provides radiation propagation and/or amplification between waveguides in the substrate and device, and the plastic material provides fatigue-resistance.

7 Claims, 4 Drawing Sheets

U.S. PATENT DOCUMENTS

| | | |
|---|---|---|
| 6,610,591 B1 * | 8/2003 | Jiang et al. ................. 438/613 |
| 6,643,446 B2 | 11/2003 | Moidu et al. |
| 6,781,065 B1 * | 8/2004 | Palmteer ..................... 174/260 |
| 6,799,976 B1 * | 10/2004 | Mok et al. .................... 439/55 |
| 6,901,203 B1 | 5/2005 | Czubarow et al. |
| 6,906,427 B2 * | 6/2005 | Tanaka et al. ............... 257/778 |
| 7,227,263 B2 * | 6/2007 | Yamaguchi ................. 257/738 |
| 7,268,430 B2 * | 9/2007 | Suga et al. .................. 257/737 |
| 2004/0028352 A1 * | 2/2004 | Sakurai et al. ................ 385/92 |
| 2004/0250950 A1 * | 12/2004 | Dubrow ...................... 156/276 |
| 2006/0104566 A1 * | 5/2006 | Bakir et al. ................... 385/14 |
| 2007/0077008 A1 * | 4/2007 | Jeon et al. ..................... 385/49 |

\* cited by examiner

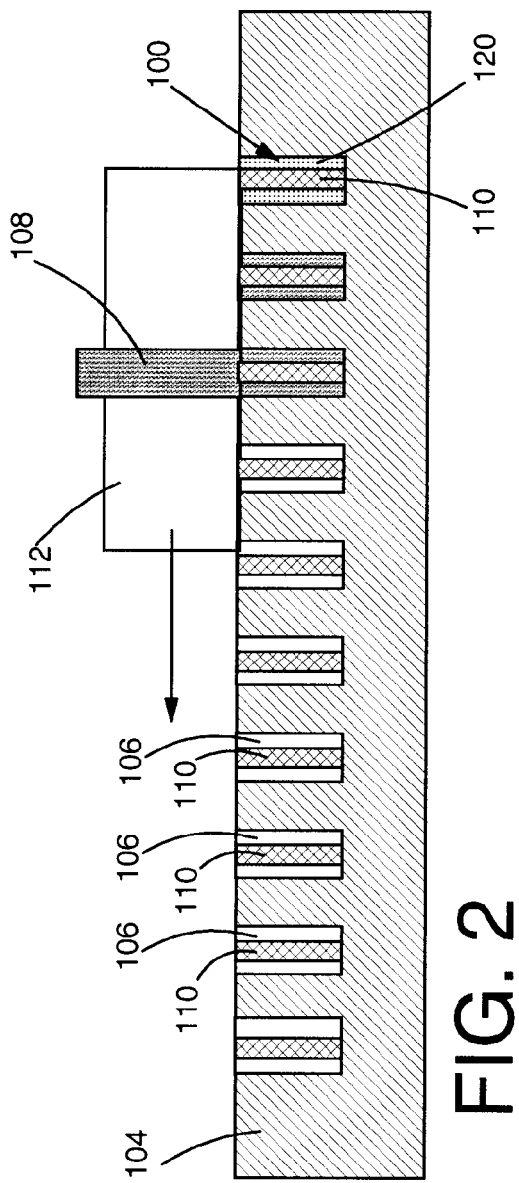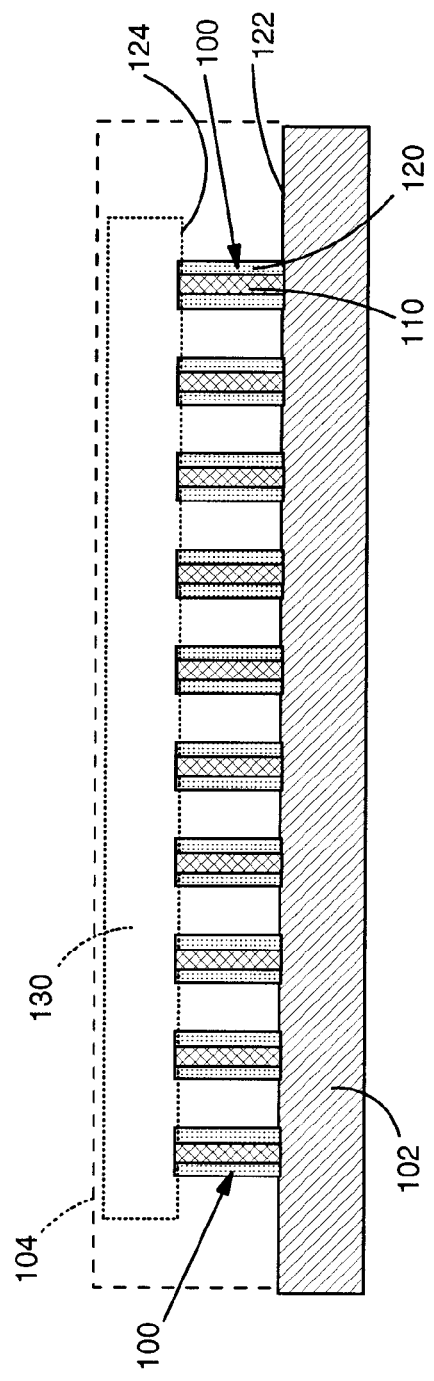

COMPOSITE INTERCONNECT STRUCTURE USING INJECTION MOLDED SOLDER TECHNIQUE

BACKGROUND OF THE INVENTION

1. Technical Field

The invention relates generally to interconnect structures, and more particularly, to a composite interconnect structure formed using injected molded solder.

2. Background Art

Composite interconnect structures for coupling a semiconductor device to a substrate are advantageous for a number of reasons. For example, Japanese Patent Publication 7066209A discloses a composite interconnect structure including solder (e.g., gold-tin) with a core of a higher melting point than solder. The composite interconnect structure allows mounting of an optical device on a circuit board without tilting the devices, i.e., the core prevents a bump from compressing more than other bumps during mounting. This reference, however, uses a very difficult process in which the composite interconnect structure is formed by cutting the material into bumps. In addition, this particular interconnect structure does not achieve all of the possible advantages of composite interconnect structures.

FIG. 1 shows one part of a conventional injection molded solder process for forming interconnects. In this process, a molten solder injector 2 is moved across a mold 4 including a plurality of openings 6, injecting the openings with molten solder 8. Mold 4 is then allowed to cool and is positioned over a wafer including one or more semiconductor devices (not shown) and heated to re-flow hardened solder 10 to wettable pads (not shown) on the semiconductor devices. Each semiconductor device (not shown) is then positioned over a substrate and reflowed such that solder 10 forms an interconnection between the semiconductor device and substrate. This technique, however, is incapable of forming composite interconnect structures.

There is a need in the art for a way to provide a composite interconnect structure that does not suffer from the problems of the related art.

SUMMARY OF THE INVENTION

Composite interconnect structure forming methods using injection molded solder are disclosed. The methods provide a mold having at least one opening formed therein with each opening including a member of a material dissimilar to a solder to be used to fill the opening, and then fill the remainder of each opening with solder to form the composite interconnect structure. The resulting composite interconnect structure can be leveraged to achieve a much larger variety of composite structures than exhibited by the prior art. For example, the material may be chosen to be more electrically conductive than the solder portion, more electromigration-resistant than the solder portion and/or more fatigue-resistant than the solder portion. In one embodiment, the composite interconnect structure can include an optical structure, or plastic or ceramic material. The optical structure provides radiation propagation and/or amplification between waveguides in the substrate and device, and the plastic material provides fatigue-resistance.

A first aspect of the invention provides a method of forming a composite interconnect structure on at least one of a substrate and a semiconductor device, the method comprising the steps of: providing a mold having at least one opening formed therein, each opening including a member of a material dissimilar to a solder to be used to fill a remainder of each opening; injecting the remainder of each opening with a molten solder; cooling the molten solder to form the composite interconnect structure including the member and a solder portion; and connecting the composite interconnect structure to a preselected site on at least one of the substrate and the semiconductor device.

A second aspect of the invention provides a composite interconnect structure comprising: a solder portion; and a member including a material dissimilar to the solder portion, the member chosen from the group consisting of: an optical structure, a ceramic structure, a plastic structure and a carbon-nanotube structure.

A third aspect of the invention provides a method of forming a composite interconnect structure, the method comprising the steps of: providing a mold having at least one opening formed therein, each opening including a member including a material that is at least one of the following: more electrically conductive than a solder to be used to fill a remainder of each opening, more electromigration-resistant than the solder and more fatigue-resistant than the solder; injecting the remainder of each opening with a molten solder; cooling the molten solder to form the composite interconnect structure including the member and a solder portion; and connecting the composite interconnect structure to a preselected site on at least one of a substrate and a semiconductor device.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 2-3 show one embodiment of a method of forming a composite interconnect structure according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
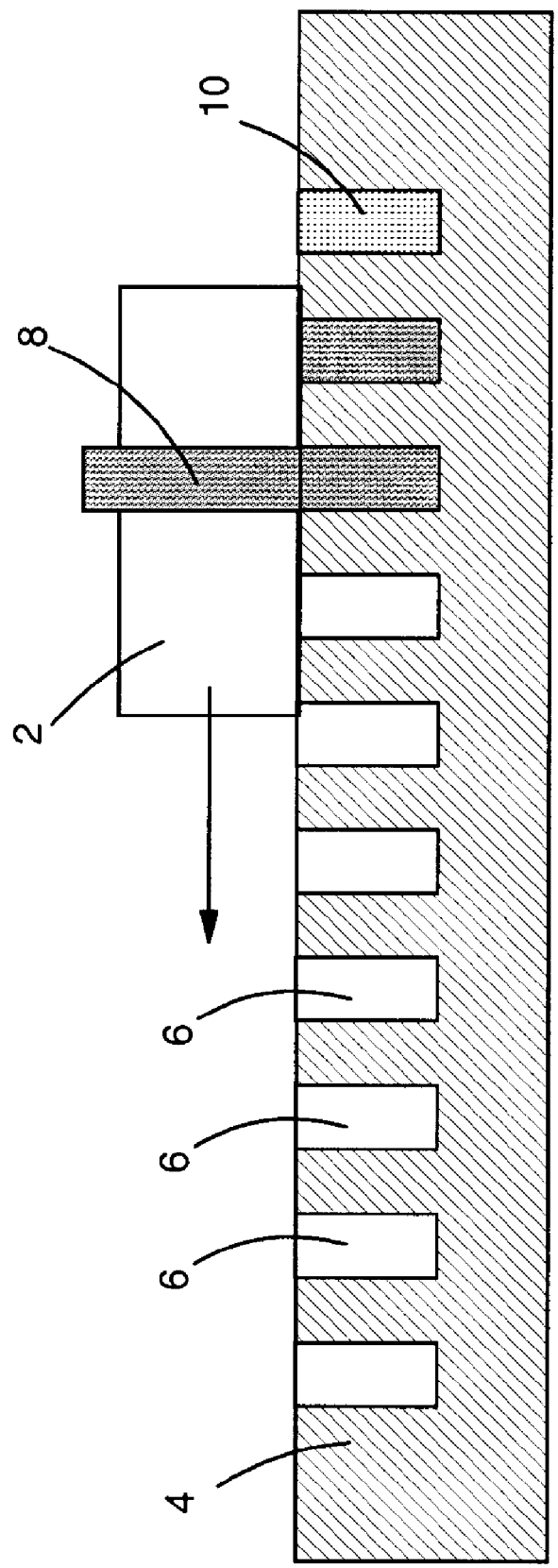
FIG. 1 shows a conventional injection molded solder technique for making interconnect structures.

Turning to the drawings, FIGS. 2-3 show one embodiment of a method of forming a composite interconnect structure 100 on at least one of a substrate 102 (FIG. 3 only) and a semiconductor device 130 (FIG. 3 only) prior to packaging. In a first step, shown in FIG. 1, a mold 104 is provided having at least one opening 106 formed therein. As shown, mold 104 typically includes a plurality of openings 106. Each opening 106 includes a member 110 of a material dissimilar to a solder 108 (shown molten in FIG. 2) to be used to fill a remainder of each opening. Next, as also shown in FIG. 2, the remainder of each opening 106 is filled (injected) with a molten solder 108 using any now known or later developed molten solder injection device 112. As known to those with skill in the art, this step typically includes bringing molten solder injection device 112 into close proximity to mold 104 and injecting molten solder 108 into each opening 106. In this case, only the portion of each opening 106 not consumed by member 110 (i.e., the remainder) is injected with molten solder 108. Next, molten solder 108 is cooled, i.e., forcibly cooled or allowed to cool, to a hardened solder portion 120 to form composite interconnect structure 100 including member 110 in each opening. Hence, each composite interconnect structure 100 includes member 110 and hardened solder portion 120.

FIG. 3 shows the next step of connecting composite interconnect structure 100 to a preselected site 122 on at least one of substrate 102 and semiconductor device 130. In one embodiment, this step includes aligning opening 106 in mold 104 to preselected site 122 of substrate 102, and heating to cause hardened solder portion 120 to flow to preselected site 122 of substrate 102 and member 110 to move with the (now molten) solder. As is conventional for injected molded solder interconnects, the aligning step may include bringing a surface of mold 104 (shown in phantom in FIG. 3) into contact with a surface of substrate 102. The heating may be caused in any now known or later developed manner used in forming injection molded solder interconnects, e.g., heating mold 104. Next, this step includes cooling to solidify composite interconnect structure 100 on preselected site 122 of substrate 102, and removing mold 104. Again, the cooling may be forcible cooling or simply allowing molten solder to cool to a hardened solder portion 120. FIG. 3 also shows a semiconductor device 130 (in phantom) after connection onto composite interconnect structure 100. It should be recognized that the order of connection to substrate 102 and semiconductor device 130 may be reversed, i.e., interconnect structure 100 could be positioned on a preselected site 124 of semiconductor device 130.

The above-described method results in a composite interconnect structure 100 for substrate 102 having a (hardened) solder portion 120 and a member 110. Turning to the details of member 110, the material used to form member 110 may include any material dissimilar from solder portion 120. For example, the material may be more electrically conductive than solder portion 120, more electromigration-resistant than solder portion 120 and/or more fatigue-resistant than solder portion 120. In addition, as will be described in greater detail below, member 110 may take a variety of shapes. As shown in FIGS. 2-3, member 110 is a substantially cylindrical member positioned in the center of openings 106 such that solder portion 120 surrounds member 110. That is, opening 106 has a high aspect ratio and member 110 extends longitudinally within opening 106. However, this concentric arrangement is not necessary. In this scenario, member 110 may be provided as, for example, a plastic structure or a ceramic structure that increases fatigue-resistance by adding rigidity to composite interconnect structure 100.

Alternatively, member 110 may include, for example, a beryllium-copper (BeCu) alloy, which exhibits better fatigue-resistance than solder portion 120. Alternatively, member 110 may include a metal, (e.g., copper (Cu) or nickel (Ni)), which exhibits better electrical-conductivity and/or better electromigration-resistance than solder 120. Alternatively, member 110 may include a carbon-nanotube structure/material or composite thereof, which exhibits better electrical-conductivity and/or better electromigration-resistance than solder 120. It should also be understood that member 110 may include one or more of the above-described materials, i.e., member 110 may also include a composite material. Further, member 110 may be subject to a surface pretreatment such as a mechanical treatment (e.g., surface roughening) and/or a deposition treatment of a solder wettable material (e.g., metal sputtering) to enhance an affinity of solder 120 for member 110, i.e., render member 110 more adherent to solder 120 prior to injecting molten solder 108 into opening 106.

Figure 5A:
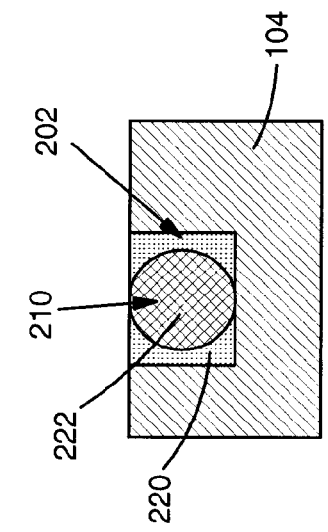
FIGS. 5A-B show another embodiment of a composite interconnect structure according to the invention.
Figure 5B:
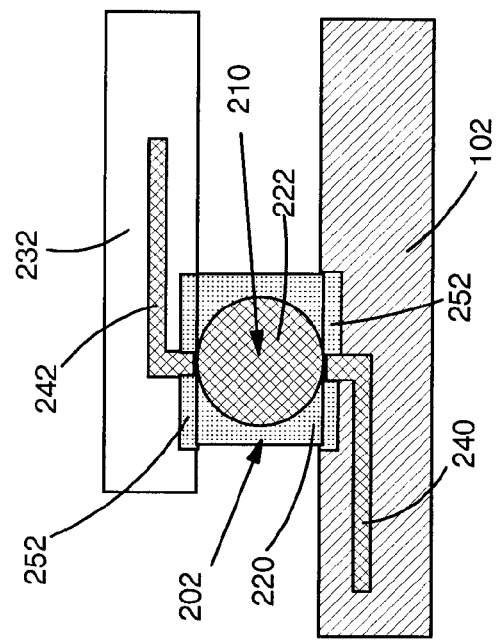
Figure 4A:
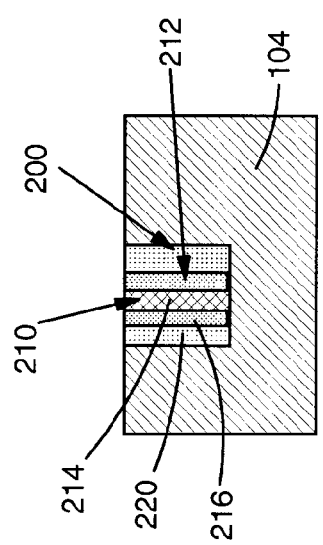
FIGS. 4A-B show one embodiment of a composite interconnect structure according to the invention.
Figure 4B:
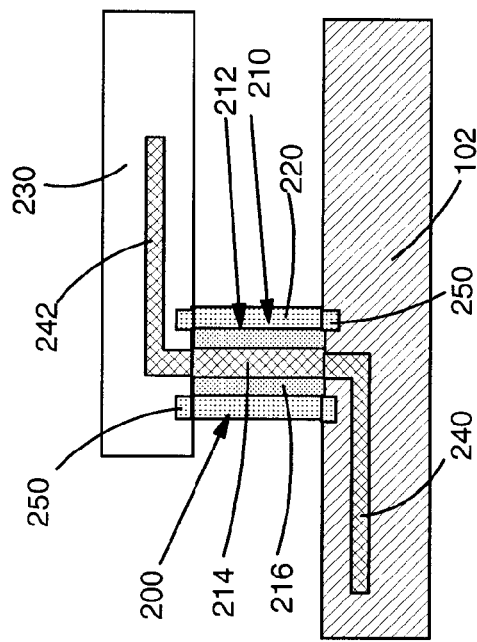

FIGS. 4A-B and FIGS. 5A-B show alternative embodiments of a member 210 in a composite interconnect structure 200, 202, respectively, according to the invention. In FIGS. 4A-4B and FIGS. 5A-B, member 210 includes an optical structure, which provides radiation propagation and/or amplification between waveguides 240, 242 in substrate 102 and semiconductor device 230 or 232, respectively. FIGS. 4A and 5A show composite interconnect structure 200, 202 in mold 104, and FIGS. 4B and 5B show composite interconnect structure 200, 202 connected between a semiconductor device 230, 232, respectively, and substrate 102.

In FIGS. 4A-B, the optical structure includes a fiber-optic element 212. In one embodiment, fiber-optic element 212 includes an optical fiber core 214 and a cladding layer 216, which is substantially surrounded by solder portion 220, i.e., other than where it meets waveguides 240, 242. Hence, member 210 may include more than one layer. However, any now known or later developed fiber optic element may be employed. In FIGS. 5A-B, the optical structure includes an optical lens 222. In either embodiment, the optical structure may (via optical fiber core 214 (FIGS. 4A-B) or optical lens 222 (FIGS. 5A-B)) communicate radiation, e.g., light, to a waveguide 240 in substrate 102 and/or a waveguide 242 in semiconductor device 230, 232. In the case where the optical structure includes optical lens 222, the radiation can be focused and amplified between waveguides 240, 242. Also, each embodiment may also include a solder-wettable ring 250, 252 for structural coupling to solder portion 220. Rings 250, 252 may be provided in semiconductor device 230, 232, respectively, and/or in substrate 102. Comparing FIG. 4B to FIG. 5B, the size of solder-wettable rings 250, 252 may be varied to accommodate whatever size solder portion 220 may exhibit. The optical structure may be formed of, for example, a plastic or a glass.

Figure 6:
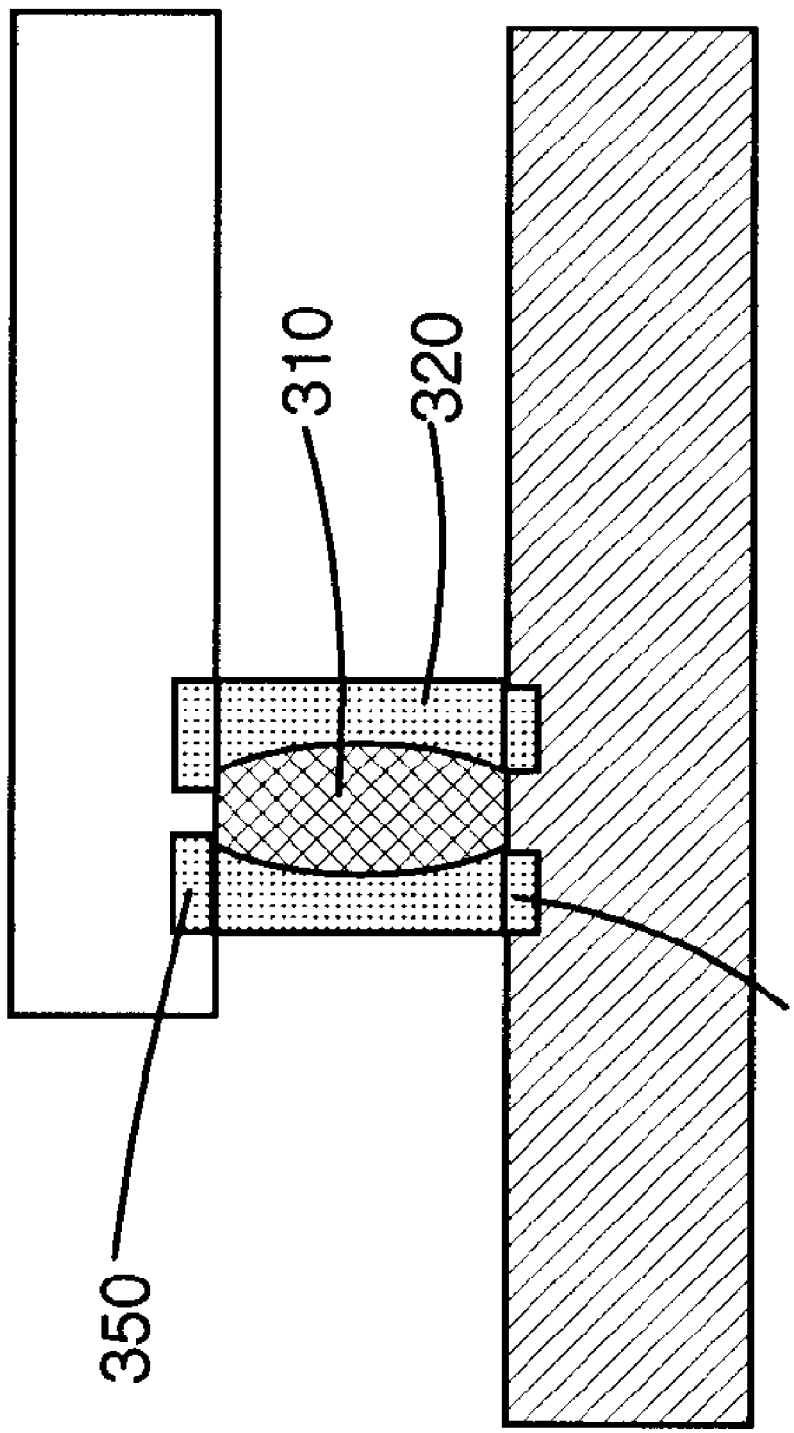
FIG. 6 shows yet another embodiment of a composite interconnect structure according to the invention.

FIG. 6 shows another alternative embodiment of a member 310. In this embodiment, member 310 can be any of the afore-mentioned materials or optical structures. In this case, however, member 310 has an oblong shape, which enhances fatigue-resistance, and may avoid the need for underfill or, alternatively, allow for the selection of an underfill whose properties are dedicated to the protection of the low-K dielectric of the semiconductor die without the need to compromise those properties in the interest of interconnect fatigue resistance. Solder portion 320 surrounds member 310. FIG. 6 also includes solder-wettable rings 350, 352.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A composite interconnect structure comprising:

a solder portion; and a member including a material dissimilar to the solder portion, the member chosen as one or a combination of structures and materials within a group consisting of: a ceramic structure and a plastic structure, wherein the member comprises a first end and a second end opposite the first end and a body extending between the first and second ends, and wherein the body is substantially surrounded by the solder portion and the first and second ends of the member are substantially free of solder, and wherein the member comprises a material which has a higher fatigue-resistance than the solder portion and wherein at least a portion of the body extending between the first and second ends has a diameter which is greater than a diameter of the first end and a diameter of the second end.

2. The composite interconnect structure of claim 1, wherein the member is chosen as one or a combination of structures and materials within a group further consisting of: a carbon-nanotube structure, wherein the material of the carbon-nanotube has a higher electrical-conductivity and electromigration-resistance than the solder portion.

3. The composite interconnect structure of claim 2, wherein the member is chosen as one or a combination of structures and materials within a group further consisting of: a metal alloy, wherein the material of the metal alloy has a higher fatigue-resistance than the solder portion.

4. The composite interconnect structure of claim 3, wherein, the metal alloy is BeCu.

5. The composite interconnect structure of claim 3, wherein the member is chosen as one or a combination of structures and materials within a group further consisting of: a metal, wherein the material of the metal has a higher electrical-conductivity and electromigration-resistance than the solder portion.

6. The composite interconnect structure of claim 1, wherein a substrate and a semiconductor device coupled to the interconnect structure each include a solder-wettable ring for structural coupling to the solder portion.

7. A composite interconnect structure comprising:

a solder portion; and a member including BeCu, a material of the solder portion being dissimilar to the BeCu, wherein the member comprises a first end and a second end opposite the first end and a body extending between the first and second ends, and wherein the body is substantially surrounded by the solder portion and the first and second ends of the member are substantially free of solder.

\* \* \* \* \*